United States Patent

Shiomoto et al.

[11] Patent Number: 5,917,873
[45] Date of Patent: Jun. 29, 1999

[54] RECEIVING APPARATUS, RECEIVING METHOD, AND DIGITAL PLL CIRCUIT

[75] Inventors: Shoji Shiomoto, Tokyo; Hirofumi Yuchi, Kanagawa, both of Japan

[73] Assignee: Sony Corporation, Tokyo, Japan

[21] Appl. No.: 08/944,849

[22] Filed: Oct. 6, 1997

[30] Foreign Application Priority Data

Oct. 8, 1996 [JP] Japan ................................ 8-286013

[51] Int. Cl.⁶ ............................................ H03D 3/24
[52] U.S. Cl. ............................................ 375/376; 327/156
[58] Field of Search .................................. 375/374, 376, 375/294; 327/156, 160, 147; 331/DIG. 2

[56] References Cited

U.S. PATENT DOCUMENTS 5,699,392 12/1997 Dokic ........................................ 375/376
5,768,326 6/1998 Koshiro et al. ........................... 375/376

FOREIGN PATENT DOCUMENTS 0 684 740 11/1995 European Pat. Off. .
0 710 033 5/1996 European Pat. Off. .

*Primary Examiner*—Temesghen Ghebretinsae
*Attorney, Agent, or Firm*—Frommer Lawrence & Hung, LLP.; William S. Frommer; Dennis M. Smid

[57] ABSTRACT

A PCR is detected from a bit stream by a PCR extracting circuit. When the time reference value is detected, an STC counter counts a clock oscillated by a VCO and compares the value of the STC counter and the value of the PCR. The phase difference is fed back to the VCO through a digital filter. In the control start stage, the gain of the digital filter is designated to a large value. Thus, the phase difference is quickly converged to the allowable difference range. In the lock stage, the gain is designated to a small value. Thus, the control operation is stably performed. In the nearly unlock stage, the gain is designated to a middle value. Thus, the phase difference is quickly pulled to the allowable difference range.

11 Claims, 12 Drawing Sheets

RECEIVING APPARATUS, RECEIVING METHOD, AND DIGITAL PLL CIRCUIT

BACKGROUND OF THE INVENTION

1. Field of the Invention

The present invention relates to a receiving apparatus suitable for directly receiving a digital direct satellite broadcast, a receiving method therewith, and a digital PLL circuit therewith.

2. Description of the Related Art

A digital direct satellite broadcast has been performed. In the digital direct satellite broadcast, a video signal is compressed with highly efficient encoding technology corresponding to MPEG (Moving Picture Expert Group) system and a digital video signal and a digital audio signal are broadcast by a satellite has been performed. FIG. 15 shows an example of a receiving system of such a digital direct satellite broadcast.

In FIG. 15, reference numeral 101 is a satellite that performs a digital satellite broadcast. Reference numeral 102 is a parabola antenna that receives a broadcast signal from the satellite 101. Reference numeral 103 is an IRD (Integrated Receiver/Decoder) that demodulates a video signal from the received broadcast signal. Reference numeral 104 is a monitor that displays a received picture.

A stream of a digital video signal corresponding to the MPEG (Moving Picture Experts Group) and a digital audio signal are sent with a 12 GHz band carrier through the satellite 101. A signal sent from the satellite 101 is received by the parabola antenna 102. The parabola antenna 102 is provided with an LNB (Low Noise Block Down-converter) 105. The signal received by the parabola antenna 102 is down-converted into a signal with a predetermined frequency by the LNB 105.

An output signal of the LNB 105 is supplied to the IRD 103. The IRD 103 comprises a tuner circuit that selects a predetermined channel, a demodulating circuit that demodulates a bit stream, a demultiplexer that separates the bit stream into video data and audio data, an MPEG video decoder that decodes an MPEG video signal, an analog video encoding circuit that generates for example an NTSC composite video signal with the decoded video signal, and an MPEG audio decoder that decodes the MPEG audio signal. The signal sent through the satellite 101 is demodulated by the IRD 103. An output signal of the IRD 103 is supplied to the monitor 104.

As described above, in the digital direct satellite broadcast, the MPEG system is used. With the highly efficient encoding technology, a video signal is compressed. The compressed video signal is sent along with a digital audio signal. In the MPEG system, the digital video signal and the digital audio signal are sent as a stream of packets. A time stamp is placed to each decode/reproduction unit of the video signal and audio signal. The decode/reproduction unit is referred to as access unit. The time stamp is composed of a PTS (Presentation Time Stamp) and a DTS (Decoding Time Stamp). The PTS is time management information of reproduced output data. The DTS is time management information of decoded data. The time stamp and an STC (System Time Clock) that is reference time are compared. When the time stamp accords with the reference time, the relevant access unit is reproduced.

To designate a time reference, an SCR (System Clock Reference) and a PCR (Program Clock Reference) are sent. To calibrate the value of the STC as the time reference, the values of the SCR and PCR are used. The system clock is oscillated with a PLL that is in association with the STC.

In other words, the PLL comprises a VCO that oscillates a system clock at a frequency of 27 MHz, an STC counter that counts with an output signal of the VCO, a phase comparing circuit that compares the value of the SCR or PCR with the value of the STC counter, and a loop filter to which output data of the phase comparing circuit is supplied. The STC counter is set with the received SCR and PCR. With output data of the phase comparing circuit through the loop filter, the VCO is controlled.

In the PLL that compares the value of SCR or PCR with the value of the STC, in the control start stage, the loop should be quickly pulled and locked so that the value of the STC accords with the value of the SCR or PCR. In the signal receive stage, the signal should be stably controlled. If the phase difference between the value of the STC and the value of the SCR or PCR exceeds a predetermined range and thereby the loop is unlocked due to any region, the phase difference between the value of the STC and the value of the SCR or PCR should be quickly pulled in the predetermined range.

However, it is difficult to satisfy all these conditions. In other words, in the case that the gain of the PLL is high, since the loop can be quickly pulled, it is advantageous in the control start stage. However, when the loop gain of the PLL is high, in the normal receive state, the PLL does not stably operate.

OBJECTS AND SUMMARY OF THE INVENTION

Therefore, an object of the present invention is to provide a digital PLL circuit, a receiving apparatus therewith, and a receiving method therewith that allow a loop to be quickly pulled in a predetermined phase difference range in the control start stage, the loop to be stably controlled in the normal receive stage, and the loop to be quickly restored to the predetermined phase difference range in the nearly unlock stage when a system clock is oscillated with a time reference value of a received bit stream.

The present invention is a receiving apparatus having a digital PLL circuit for generating a system clock corresponding to time reference information sent along with data and a data process means for processing the data corresponding to the system clock, the PLL circuit comprising a time reference information detecting means for detecting time reference information from the data and outputting the time reference information, a variable frequency generating means for generating a clock with a predetermined frequency, a clock count number outputting means for counting the clock and outputting the counted result, a phase comparing means for comparing the time reference information and the counted result at a timing of which the time reference information is detected, and a feedback loop for feeding back the phase difference as a control signal to the variable frequency generating means through a filter means, wherein a designated state of the filter means is varied corresponding to the phase difference.

The PLL circuit has at least a first loop gain used in a control beginning state and a second loop gain used in other than the control beginning state, the first loop gain being larger than the second loop gain.

The filter means has a detecting means for detecting whether the phase difference is within a predetermined phase difference. A first loop gain in the case that the phase difference is within the predetermined phase difference is smaller than a second loop gain in the case that the phase difference is not within the predetermined phase difference.

The detecting means further determines whether or not the difference between a first phase difference detected at a first timing and a second phase difference detected at a second timing immediately preceding the first timing is within a predetermined difference. A loop gain of the filter means is designated to the first loop gain when the difference is within the predetermined difference and when the phase difference is within the predetermined phase difference.

The PLL circuit divides the difference between twice a first phase difference detected at a first timing and a second phase difference detected at a second timing immediately preceding the first timing by a value corresponding to an interval between the first timing and the second timing, multiplies the divided result by a predetermined coefficient K, adds the multiplied result and a control value detected at the second timing, and obtains the added result as a control value of the first timing.

The PLL circuit varies the coefficient K so as to vary the designated state.

These and other objects, features and advantages of the present invention will become more apparent in light of the following detailed description of a best mode embodiment thereof, as illustrated in the accompanying drawings.

DETAILED DESCRIPTION OF THE PREFERRED EMBODIMENTS

Figure 1:
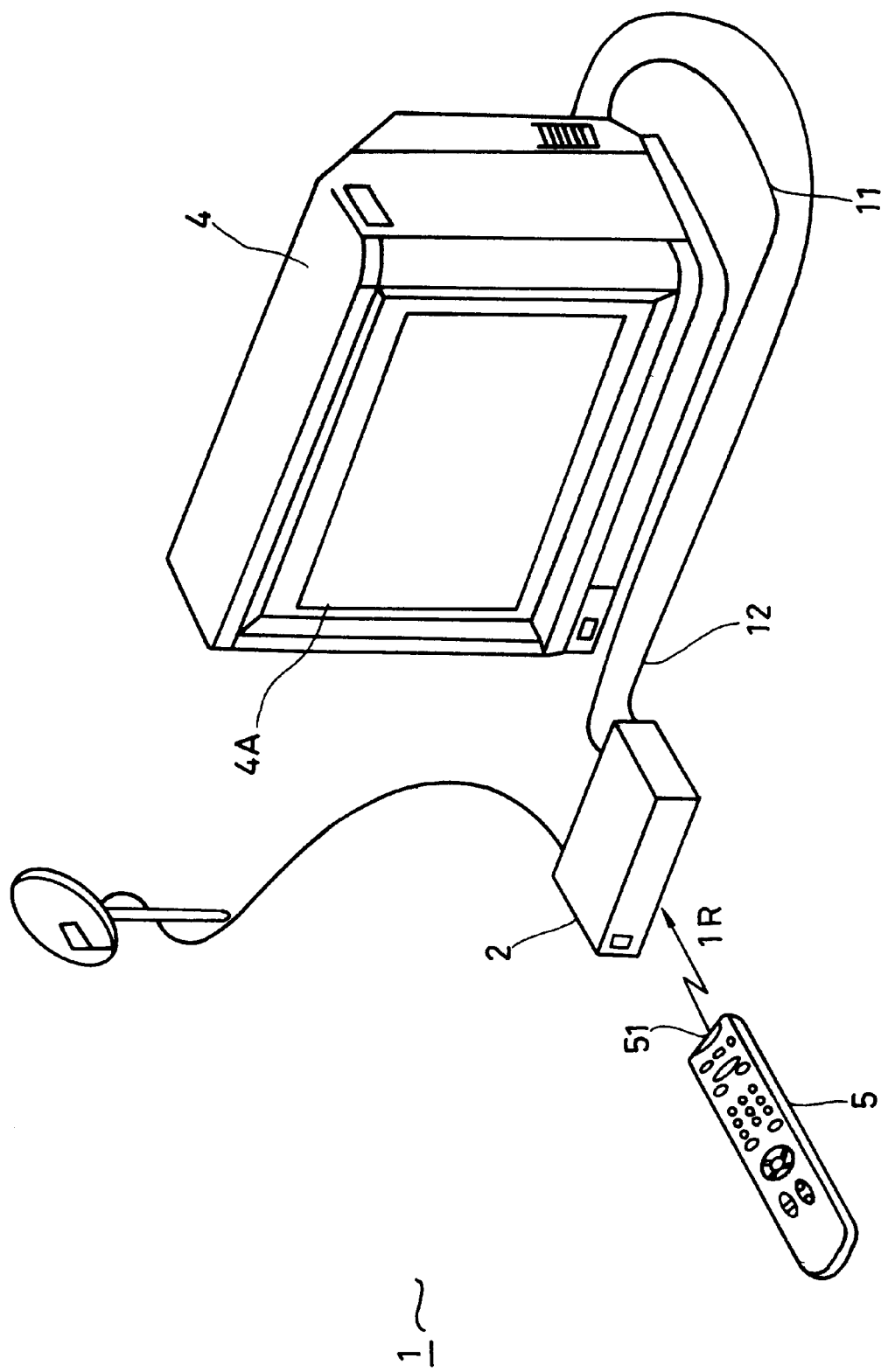
FIG. 1 is a perspective view showing an example of the structure of an AV system according to the present invention.

FIG. 1 is a schematic diagram showing an example of the structure of an AV (Audio Video) system according to the present invention. In this embodiment, the AV system comprises an IRD (Integrated Receiver/Decoder) 2 and a monitor unit 4. The IRD 2 demodulates a signal received from a satellite (a broadcast satellite or a communication satellite) through a parabola antenna 3. The monitor unit 4 and the IRD 2 are mutually connected by an AV line 11 and a control line 12.

The user of the AV system can input a command as an IR (Infrared) signal to the IRD 2 with a remote commander 5. In other words, when the user operates a predetermined button of a button switch 100 (see FIG. 5) on the remote commander 5, an IR radiating portion 51 radiates a relevant infrared signal. The infrared signal is received by an IR receiving portion 24 of the IRD 2 (see FIG. 4).

Figure 2:
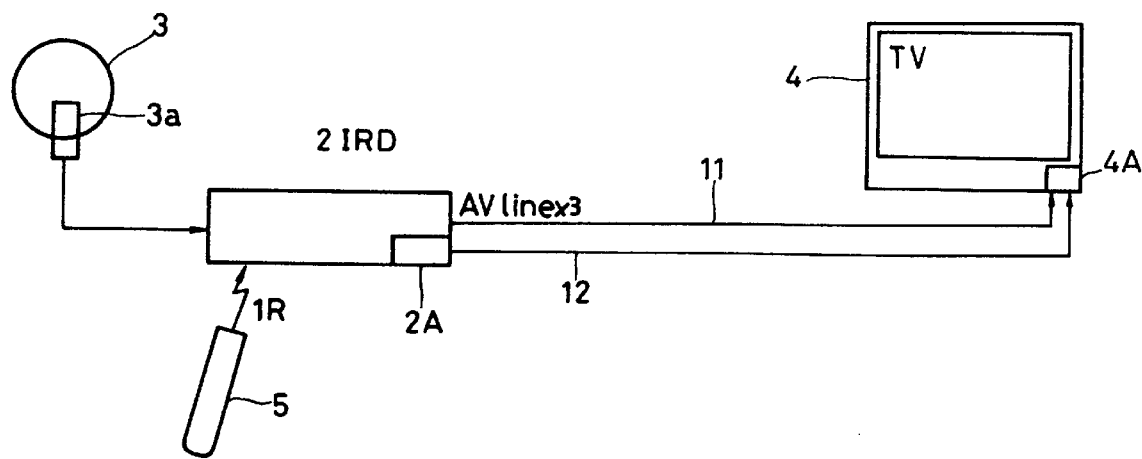
FIG. 2 is a schematic diagram showing electric connections of the AV system shown in FIG. 1.

FIG. 2 shows electric connections of the AV system 1 shown in FIG. 1. The parabola antenna has an LNB (Low Noise Block down-converter) 3a that converts a signal received from the satellite to a signal with a predetermined frequency and supplies the resultant signal to the IRD 2. The IRD 2 supplies the output signal to the monitor unit 4 through the AV line 11. The AV line 11 is composed of for example three lines that are a composite video signal line, an audio L signal line, and an audio R signal line.

The IRD 2 also has an AV unit control signal sending/receiving portion 2A. The monitor unit 4 also has an AV unit control signal sending/receiving portion 4A. The AV unit control signal sending/receiving portions 2A and 4A are mutually connected by the control line 12 composed of a wired SIRCS (Sony Infrared Remote Control System, which is a trademark of SONY).

Figure 3:
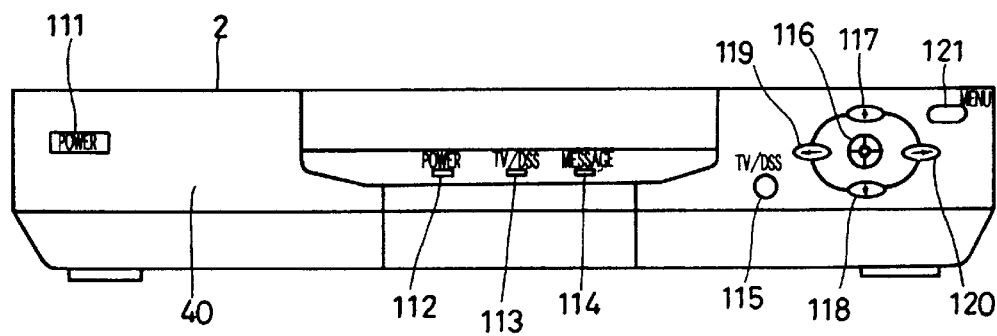
FIG. 3 is a front view showing an example of the structure of the front panel of an IRD shown in FIG. 1.

FIG. 3 shows an example of the structure of the front panel of the IRD 2. On the left of the IRD 2, a power button 111 is disposed. The power button switch 111 is used to turn on or off the power. When the power is turned on, an LED 112 lights up. On the right of the LED 112, LEDs 113 and 114 are disposed. The LED 113 lights up when a DSS mode is selected. In the DSS mode, a signal received from the satellite is output. The LED 113 goes out when a television (TV) mode is selected. The LED 114 lights up when a predetermined message is sent to the IRD 2 from the satellite. When the user acknowledges the message on the monitor unit 4, the LED 114 goes out.

When a TV/DSS button switch 115 is turned on, the DSS mode is set. When the TV/DSS button switch 115 is turned off, the TV mode is set. The menu button switch 121 is operated when a menu is displayed on the monitor unit 4.

At an upper position, a lower position, a left position, and a right position of a select button switch 116, an up button switch 117, a down button switch 118, a left button switch 119, and a right button switch 120 are disposed, respectively. The up button switch 117, the down button switch 118, the left button switch 119, and the right button switch 120 are used to move the cursor upward, downward, leftward, and rightward, respectively. The select button switch 116 is used to confirm a selected menu item.

Figure 4:
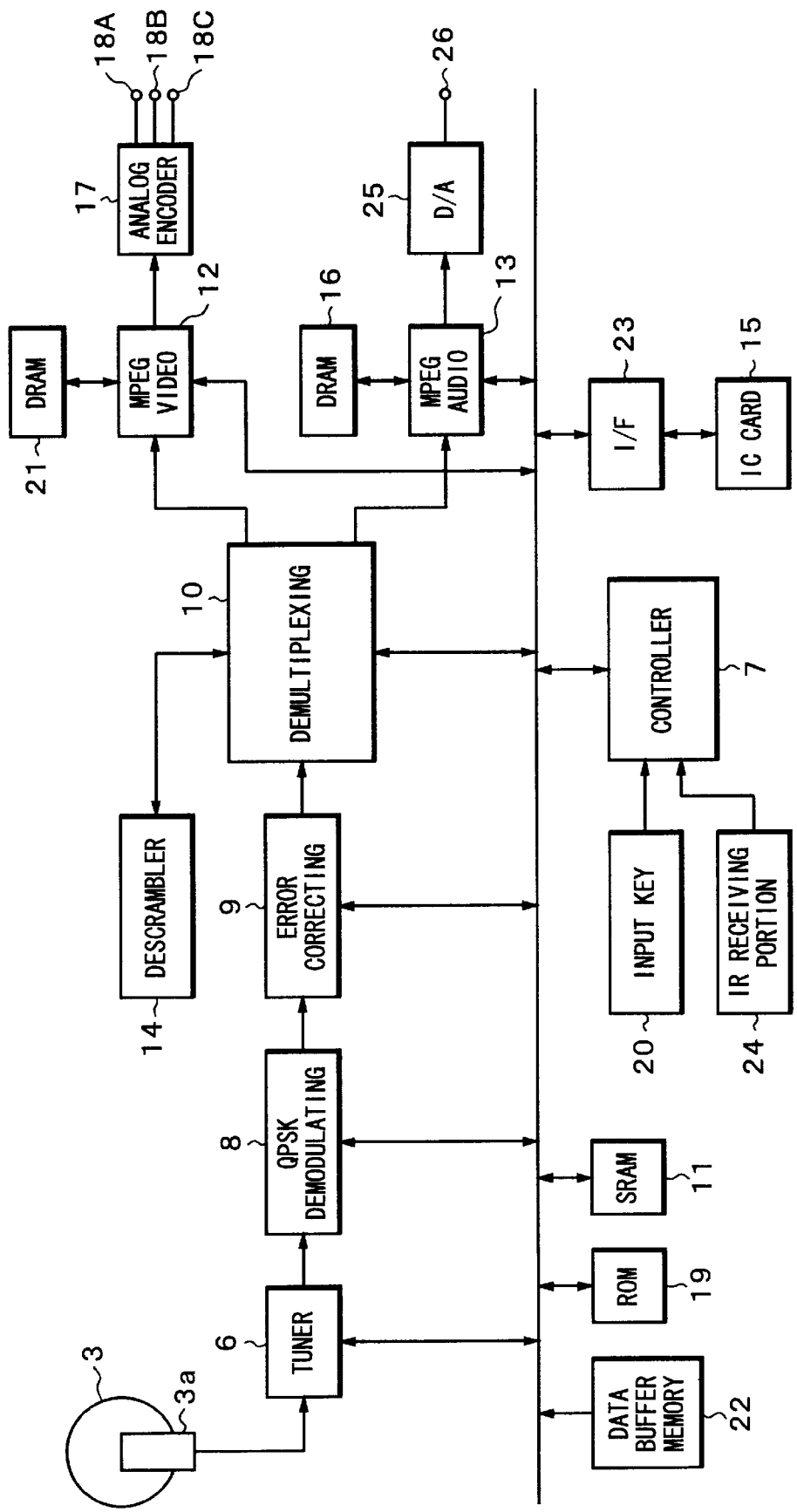
FIG. 4 is a block diagram showing an example of a satellite broadcast receiving apparatus according to the present invention.

FIG. 4 shows an example of the structure of a satellite broadcast IRD 2 according to the present invention. In FIG. 4, a digital satellite broadcast is received from a satellite 4 through a parabola antenna 3. A received signal of the parabola antenna 3 is supplied to an LNB 3a disposed on the parabola antenna 3. The LNB 3a down-converts the received signal into a signal with a predetermined frequency.

An output signal of the LNB 3a is supplied to a tuner circuit 6. The tuner circuit 6 selects a signal of a predetermined channel from the received signal corresponding to a channel select signal received from a controller 7.

An output signal of the tuner circuit 6 is supplied to a QPSK demodulating circuit 8. The QPSK demodulating circuit 8 demodulates the received signal corresponding to the QPSK method. Thus, a bit stream of the received signal is demodulated. An output signal of the QPSK demodulating circuit 8 is supplied to an error correcting circuit 9. The error correcting circuit 9 detects and corrects an error of the bit stream.

An output signal of the error correcting circuit 9 is supplied to a demultiplexer 10. The demultiplexer 10 receives a bit stream signal from the error correcting circuit 9, temporarily stores the bit stream signal in a data buffer memory (SRAM) 11, frames the received signal in a sequence of packets, determines whether or not each packet is desired data, and separates the resultant data into video data and audio data. The video data is supplied to an MPEG video decoder 12. The audio data is supplied to an MPEG audio decoder 13.

When received data has been encrypted, the data is sent to a descrambler 14. A decrypting key and a decrypting program necessary for decrypting the encrypted data are stored in an IC card 15. When the receiving apparatus is provided with the IC card 15, the descrambler 14 decrypts the encrypted data with the decrypting key stored in the IC card 15. The demultiplexer 10 separates the decrypted data into video data and audio data. The video data is supplied to the MPEG video decoder 12. The audio data is supplied to the MPEG audio decoder 13.

The MPEG video decoder 12, temporarily stores the received digital video signal in a DRAM 21, decodes a video signal that has been compressed corresponding to the MPEG system. The MPEG system is a highly efficient encoding system of which picture data is compressed with a combination of DCT and moving compensation technologies. The MPEG video decoder 12 decodes a component video signal. An output signal of the MPEG video decoder 12 is supplied to an analog video encoder 17. The analog video encoder 17 forms a luminance signal (Y), a chroma signal (C), and a composite video signal (V) corresponding to for example the NTSC system. The video signal is supplied from output terminals 8A to 8C.

For the MPEG video decoder 12, an MPEG 2 decoding LSI (STi 3500) (SGS-Thomson Microelectronics Company) may be used. Martin Bolton describes the detail of the STi 3500 in Nikkei Electronics, Nikkei PB Company, No. 603, Mar. 14, 1994, pp 101–110.

In addition, with regard to the MPEG2-Transport stream, refer to "Latest MPEG Textbook", ASCII Corp., Aug. 1, 1994, pp 231–253.

The MPEG audio decoder 13 decodes an audio signal corresponding to the MPEG system. The MPEG audio decoder 13 temporarily stores the received digital audio signal in a DRAM and decodes a digital audio signal. An output signal of the MPEG audio decoder 13 is supplied to a D/A converter 25. The D/A converter 25 converts a digital audio signal into an analog audio signal. An output signal of the D/A converter 25 is supplied from an output terminal 26.

In this embodiment, the video signal and the audio signal are supplied to the monitor unit 4 through the AV line 11.

The controller 7 executes a variety of processes corresponding to a program stored in a ROM 19. For example, the controller 7 controls the tuner 6, the QPSK demodulating circuit 8, and the error correcting circuit 9. In addition, the controller 7 controls the AV unit control signal sending/receiving portion 2A so as to output a predetermined control signal to another AV unit (in this embodiment, the monitor unit 4) through the control line 12 and receive a control signal from another AV unit.

The user can directly input a desired command to the controller 7 with the operation button switch (see FIG. 3) on the front panel 40. When the user operates the remote commander 5, the IR radiating portion 51 radiates an infrared signal. The infrared signal is received by the IR receiving portion 24. The resultant signal is supplied to the controller 7. Thus, with the remote commander 5, the user can directly input a desired command to the controller 7.

In addition, the controller 7 controls the MPEG video decoder 12 to generate predetermined OSD (On-Screen Display) data. The MPEG video decoder 12 generates predetermined OSD data under the control of the controller 7, writes the OSD data to an OSD area 21a (see FIG. 11) of the DRAM 21, and then outputs the resultant OSD data. Thus, predetermined text characters, a figure (such as a menu and a general program guide as a kind of EPG), and so forth can be output and displayed on the monitor unit 4.

Figure 5:
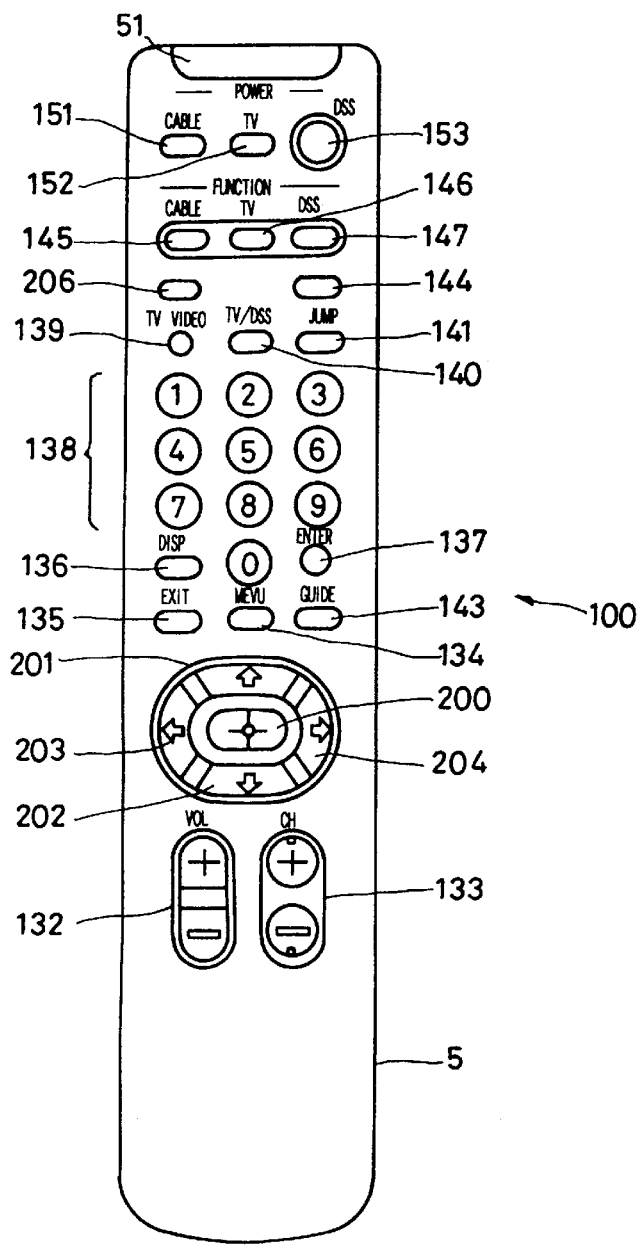
FIG. 5 is a plan view showing an example of the structure of the front panel of a remote commander shown in FIG. 1.

FIG. 5 shows an example of the structure of the button switch 100 of the remote commander 5. The arrow button switches 201 to 204 are used to move the cursor to four directions that are upper, lower, left, and right directions, respectively. A button switch 200 is pressed vertically to the upper surface of the remote commander 5 and is used to confirm a selected menu item. The menu button switch 134 is operated to display a menu screen on the monitor unit 4. An eject button switch 135 is used to display a normal screen.

A channel up/down button switch 133 is used to increment or decrement the broadcast channel number. A volume button switch 132 is used to turn up or down the volume level.

A numeric button (ten-key) switch 138 having keys "0"0 to "9" is used to input a number. An enter button switch 137 is used to confirm a number that has been input with the numeric button switch 138. When a channel is changed, a banner that consists of a new channel number, a call sign, a logo, and a mail icon is displayed for three seconds. In addition to such a simple banner, a detail banner is provided. The detail banner consists of for example, a program name, a broadcast start time, and a current time. A display button 136 is used to select the banner type.

A TV/video selection button switch 139 selects as an input of the monitor unit 4 an input of a tuner of the TV receiver or an input of a video input terminal (for example, a VCR). A TV/DSS selection button 140 is used to select a TV mode or a DSS mode. When the user changes a channel with the numeric button switch 138, the preceding channel is stored. A jump button switch 141 is used to restore the preceding channel.

A guide button switch 143 is used to directly display a general guide (EPG) on the monitor unit 4, not through the menu.

A cable button switch 145, a TV button switch 146, and a DSS button switch 147 are used to select a function (namely, select an unit category of a code of an infrared signal radiated from the remote commander 5). A cable button switch 145 is used to display on the monitor unit 4 a signal received by a cable box (not shown) through a cable. Thus, a code of a unit category assigned to the cable box is radiated as an infrared signal. Likewise, the TV button switch 146 is used to display a signal received by the tuner of the monitor unit 4. The DSS button switch 147 is used to display on the monitor unit 4 a signal received by the IRD 2 through the satellite.

When these button switches 145, 146, and 147 are turned on, respective LEDs disposed therein light up. Thus, with a relevant LED that lights up, the user can know a category unit to which a code has been sent.

When a cable power button switch 151, a TV power button switch 152, and a DSS power button switch 153 are turned on, the cable box, the monitor unit 4, and the IRD 2 are turned on or off, respectively.

Figure 6:
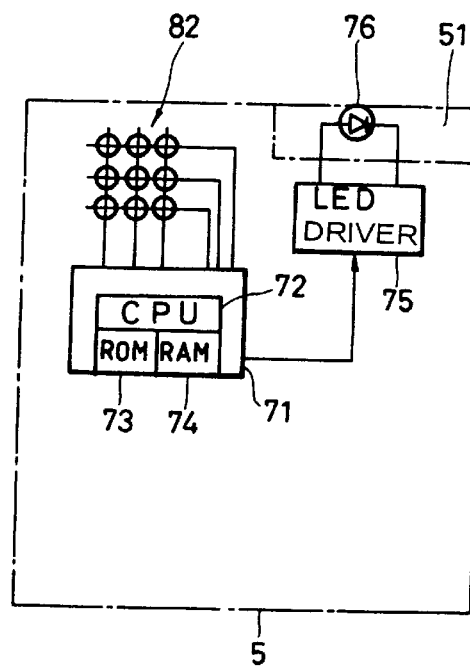
FIG. 6 is a schematic diagram showing an example of the internal structure of the remote commander shown in FIG. 5.

FIG. 6 shows an external of the internal structure of the remote commander 5. A CPU 72 that composes a microcomputer 71 always scans a button switch matrix 82 and detects whether or not the button switch 100 of the remote commander 5 has been operated. The CPU 72 executes a variety of processes corresponding to a program stored in a ROM 73 and stores required data in a RAM 74.

When the CPU 72 outputs an infrared signal, the CPU 72 drives an LED 76 through an LED driver 75.

For details of Direct Broadcast Satellite System, refer to "Technologies Supporting US Information Super Highway", by L. W. Butterworth, J. P. Godwin, and D. Radbel, Nikkei Electronics, Nikkei B P Company, Oct. 24, 1994, pp. 180–189.

FIGS. 7A to 7F show a process for generating transmission data encoded by an encoder of the direct broadcast satellite system. EPG data is composed of guide data, channel data, and program data. The guide data is overall data of the program guide. The channel data is data of channels. The program data is data of programs. The EPG data will be described later with reference to FIG. 10.

The channel data and the program data of the EPG data are segmented for each channel. In the embodiment shown in FIGS. 7A to 7F, channel data and program data of channels 1 and 2 are treated as data of segment 1. Channel data and program data of channels 3 and 4 are treated as data of segment 2. Channel data and program data of channels 5 and 6 are treated as data of segment 3.

Figure 7A:
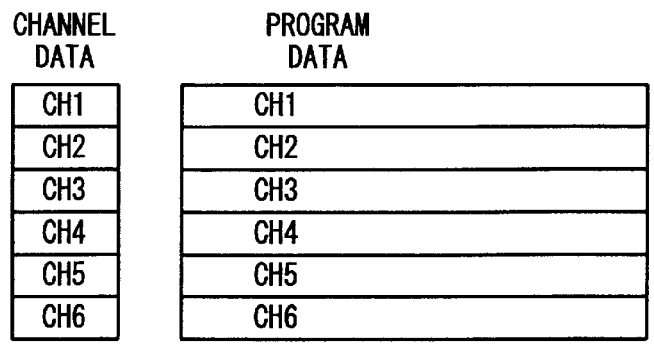
FIGS. 7A to 7F are schematic diagrams for explaining a segmentation of channel data and program data.
Figure 7B:
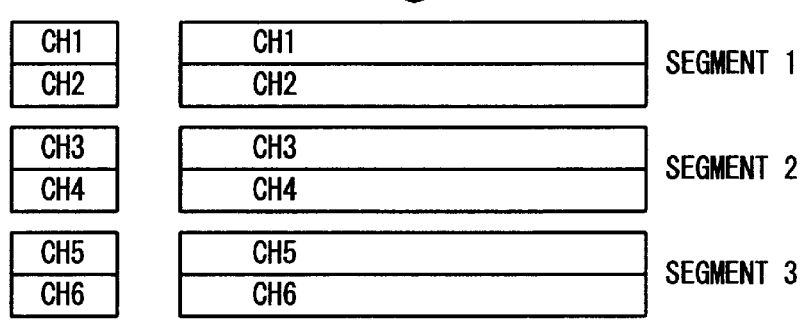
Figure 7C:
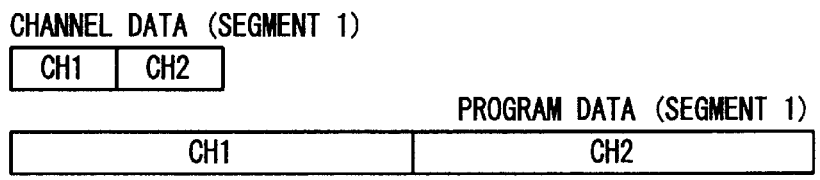
Figure 7D:
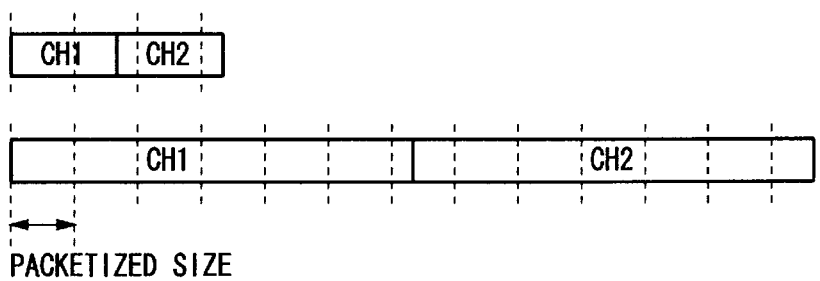
Figure 7E:
Figure 7F:
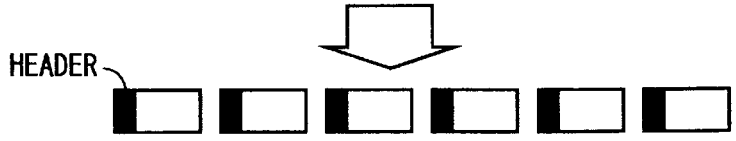

As shown in FIG. 7E, the channel data and packet data are divided into packets with a predetermined size. A header is added to each packet and the resultant data is sent as a packet.

In an encoder on the sender side, in addition to the channel data and the program data, guide data, video data, and audio data are sent as packet data to a 12.2–12.7 GHz BSS band high output transponder of the satellite. In this case, packets of a plurality of (up to nine) channels are multiplexed to a predetermined frequency signal assigned to each transponder. Each transponder transmits signals of a plurality of channels with one carrier. Thus, when there are 23 transponders, data of up to 207 (=9×23) channels can be sent.

In the IRD 2, the tuner 6, the QPSK demodulating circuit 8, and the error correcting circuit 9 receive a carrier with one frequency corresponding to a predetermined transponder and demodulate the carrier. Thus, packet data of up to nine channels is obtained. The demultiplexer 10 temporarily stores each packet obtained from the demodulated output signal in a data buffer memory 22 and then reads it. The demultiplexer 10 stores data other than header of the EPG data (guide data, channel data, and program data) to an EPG area 22a. Video packets are supplied to the DRAM 21 and stored therein. The MPEG video data 25 decodes the video packets. Audio packets are supplied to the DRAM 16 and then stored therein. The MPEG audio decoder 13 decodes the audio packets.

Figure 8:
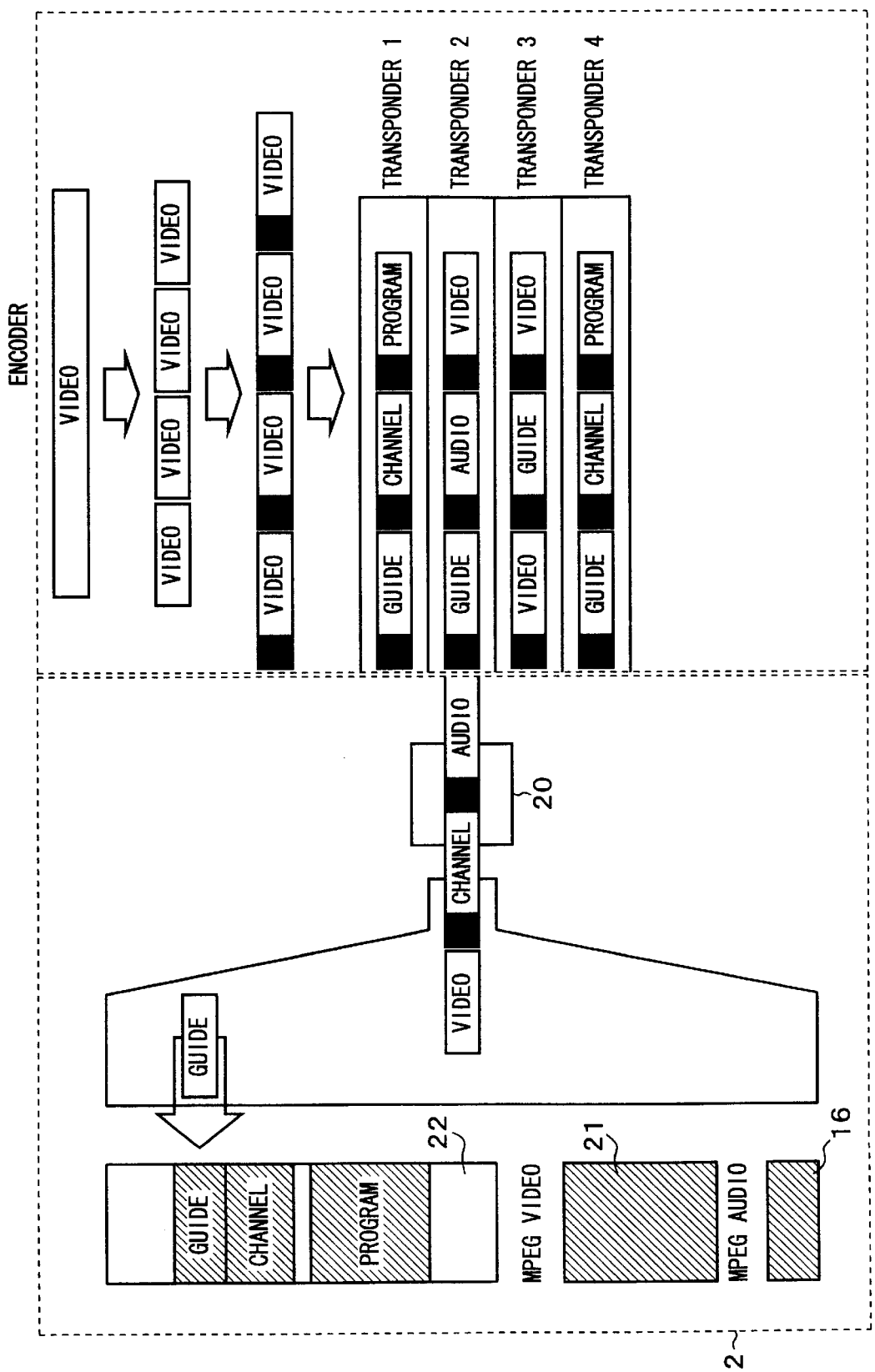
FIG. 8 is a schematic diagram showing a process of an encoder on the sender side and a process of the IRD that receives the output thereof.

For details of the process of the encoder shown in FIG. 8, refer to "Technologies Supporting US Information Super Highway", Nikkei Electronics, pp 180–189. Each transponder schedules packet data so that the transmission rate of each transponder becomes constant. The transmission rate of one carrier assigned to each transponder is 40 Mbits/sec.

For example, in the case of a moving picture such as a sports program of which scenes rapidly change, MPEG video data use many packets. Thus, when the number of such programs becomes large, the number of programs that can be sent with one transponder decreases.

On the other hand, MPEG video data with a small number of frames such as a scene of an announcer can be sent with a small number of packets. Thus, when the number of such programs is large, the number of programs that can be sent with one transponder increases.

Figure 9:
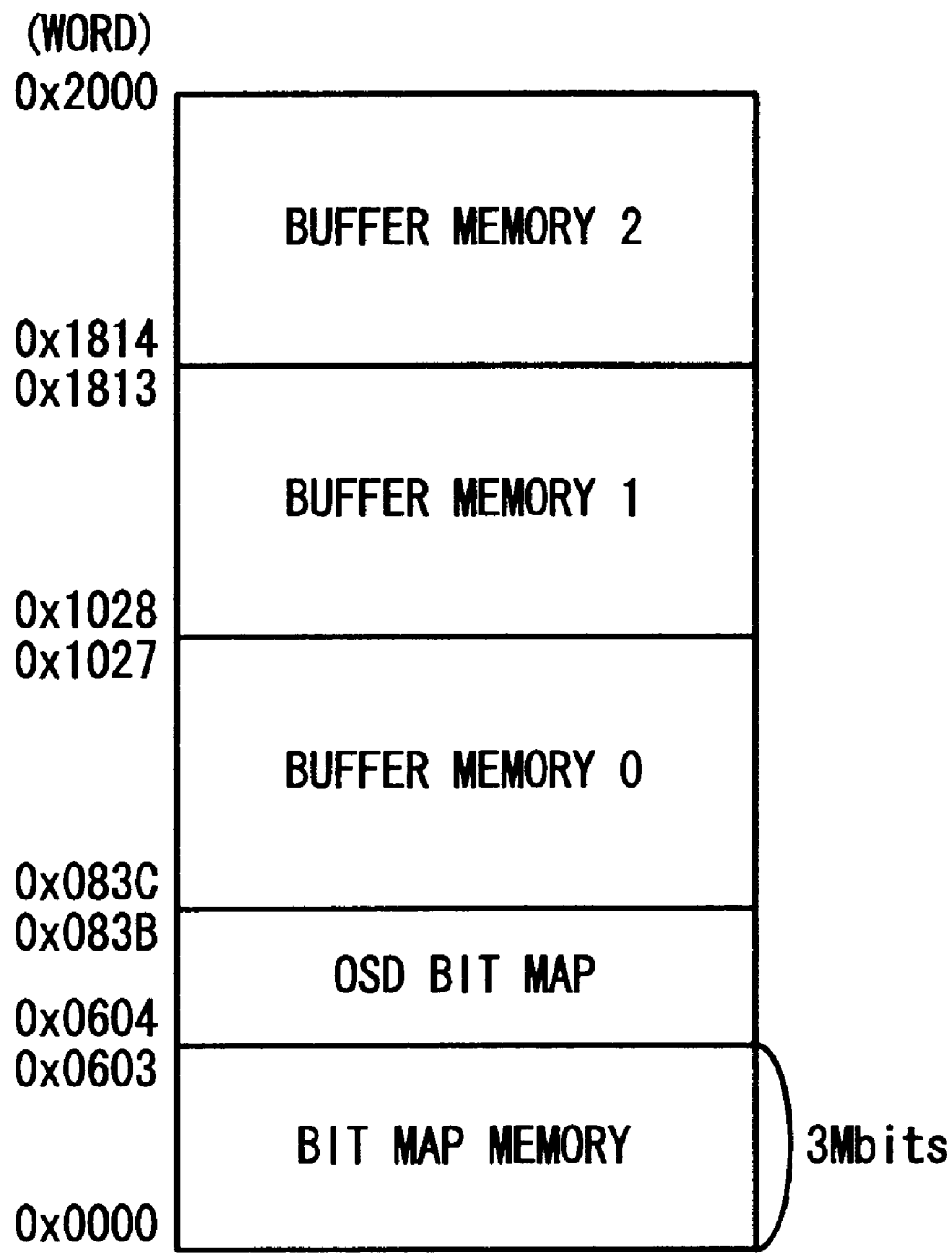
FIG. 9 is a schematic diagram for explaining the contents of a record area of a DRAM shown in FIG. 4.

FIG. 9 shows the contents of the DRAM 21. Now, it is assumed that a screen of the monitor unit 4 is structured with 720×480 pixels. In addition, it is assumed that the luminance of each pixel is represented with eight bits. Moreover, it is assumed that the color difference is represented with eight bits every the second pixel. In this case, the number of bits necessary for structuring one screen is 4147200 (=720×480× 1.5×8) bits. Assuming that one ward is composed of 64 bits, the total number of words becomes 64800 words that is equivalent to 0×FD20 words in hexadecimal notation.

However, this value of the DRAM 21 is so large that the MPEG video decoder 12 cannot manage it. Thus, when the value in hexadecimal notation is shifted to the LSB side by five bits, the value becomes 0×7EQ. In addition, since the value that is set to the register should be a multiple of 4, when a value that is larger than 0×7EQ and that is a multiple of 4, the value becomes 0×7E.

Thus, in this embodiment, buffer memories 0 to 2 that store I picture data, P picture data, and B picture data are provided. The storage capacity of each of the buffer memories 0 to 2 is 64896 words. In addition, for the OSD data, an area of 18176 words is provided. For a bit buffer memory area for temporarily storing input data, an area of 49280 words is provided.

Figure 10:
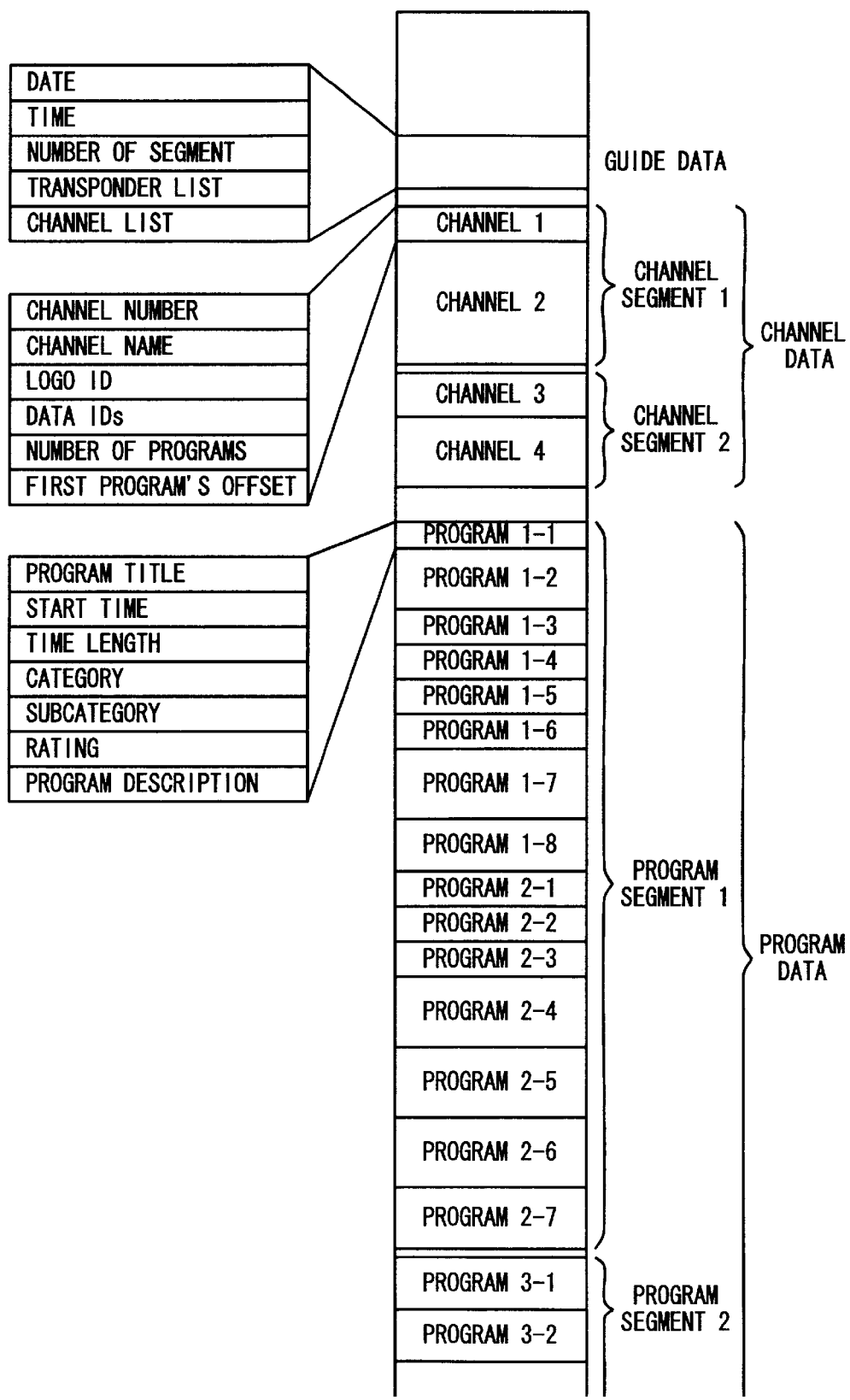
FIG. 10 is a schematic diagram for explaining contents of EPG data stored in an EPG area shown in FIG. 4.

FIG. 10 is a schematic diagram showing contents of EPG data (program guide data) stored in the EPG area 22a of the data buffer memory 22. As was described with reference to FIGS. 7 and 8, the controller 7 stores in the EPG area 22a as shown in FIG. 10 the EPG data that has been encoded by the encoder on the sender side and sent as packets.

As shown in FIG. 10, data of program guide (EPG data) is successively stored in the order of guide data, channel data, and program data.

The guide data contains "Date" that represents the current date, "Time" that represents the current time, "Number of Segments" that represents the total number of segments, "Transponder list" that represents a list of segment numbers and corresponding transponder numbers, and "Channel List" that represents a list of segment numbers and channel numbers.

The guide data is followed by channel data arranged in the order of segment 1, segment 2, segment 3, and so forth. Each segment contains data of a predetermined number of channels. In this embodiment, the segment 1 contains data of channels 1 and 2. The segment 2 contains data of channels 3 and 4.

Data of each channel contains "Channel Number" that represents the channel number, "Channel Name" that represents the call sign of the broadcast station, "Logo ID" that identifies the logo of the broadcast station, "Data IDs" that identifies MPEG video data and MPEG audio data, "Number of Programs" that represents the number of programs of the channel (for example, the channel 1), and "First Program's Offset" that represents an offset from the position (address) at which data of the first program of a particular channel is stored (for example, in the case of a channel 2, an offset value from the beginning of the program segment (in the case shown in FIG. 10, the beginning of program 1-1) to the address at which the first program data Program 2-1 is stored).

Program data contains "Program Title" that represents the name of the program, "Start Time" that represents the broadcast start time of the program, "Time Length" that represents the broadcast time period of the program, "Category" that represents the genre (category) of the program, "Subcategory" that represents the sub-genre of the genre (category), "Rating" that represents an age restriction of the program, and "Program Description" that stores detail contents of the program (including a data decoding condition of an encoded pay-per-view program). Such program data is arranged for each segment. In this embodiment, program data of segment 1 is composed of eight pieces of data of channel 1 that are Program 1-1 to Program 1-8 and seven pieces of data of channel 2 that are Program 2-1 to Program 2-7.

Figure 11:
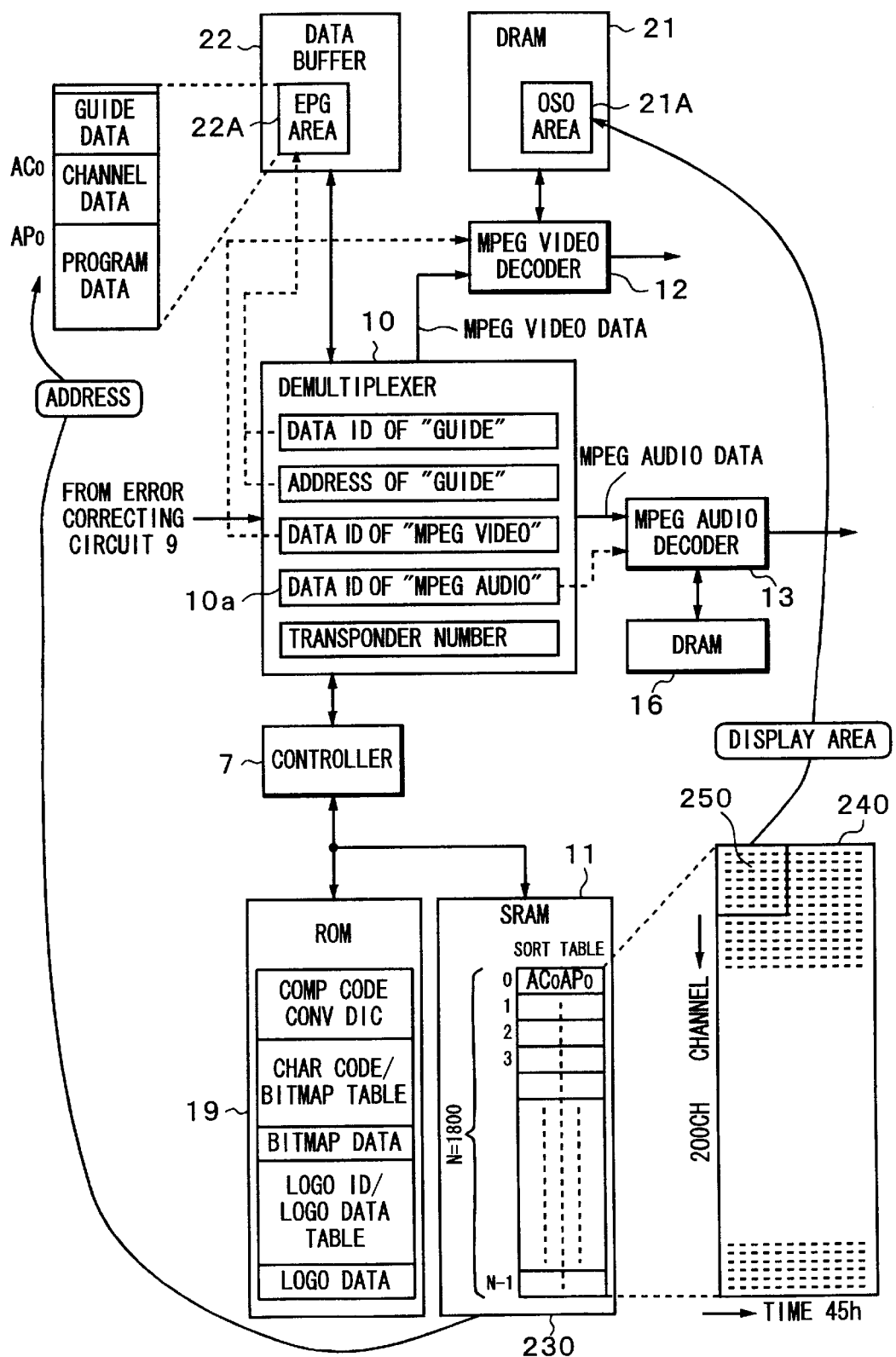
FIG. 11 is a schematic diagram for explaining an operation of a demultiplexer.

FIG. 11 is a block diagram showing a data process for displaying a general guide screen on the monitor unit 4.

A controller 7 has designated in a register 10a of a demultiplexer 10 a destination of data that had been received from an error correcting circuit 9. Data received from an error correcting circuit 9 is temporarily stored in a data buffer memory 22 and then read by the demultiplexer 10. The resultant data is sent to the destination that has been designated in the register 10a.

For example, data of packets with headers that accord with "DATA ID of 'MPEG Video'" stored in the register 10a of the demultiplexer 10 is sent to an MPEG video decoder 12. Data of packets with headers that accord with "DATA ID of 'MPEG Audio'" is sent to an MPEG audio decoder 13.

Likewise, data of packets with headers that accord with "DATA ID of 'Guide'" stored in the register 10a is sent to an EPG area 22a of a data buffer memory 22 designated by "Address of 'Guide'" stored in the register 10 and then written in the EPG area 22a. In such a manner, EPG data is stored in the EPG area 22a as shown in FIG. 10.

After the EPG data has been sent, since the headers of the packets are unnecessary, they are discarded.

When EPG data is stored in the EPG area 22a that has a storage capacity of for example 120 kbytes and thereby the EPG area 22a becomes full, the demultiplexer 10 outputs a full up status signal to the controller 7. When the controller 7 receives this control signal from the demultiplexer 10, the controller 7 stops receiving the EPG data. When the EPG data is displayed, the controller 7 performs an interpreting process such as decompressing, sorting, and decoding the EPG data.

In such a manner, EPG data of for example 200 channels is stored for 4.5 hours after the current time in the EPG area 22a. The EPG data (guide data, channel data, and program data) can be received from any transponder. In other words, the same EPG data is sent from any transponder.

The controller 7 creates a sort table 230 for searching data of a particular channel from the EPG data stored in the EPG area 22a and stores the sort table 230 in an SRAM 11. The sort table 230 corresponds to an overall EPG table 230 for searching a program of all channels (for example, 200 channels) for 4.5 hours after the current time. The controller 7 reads data in a particular display range 250 and in a particular time range from the overall EPG table 240 and writes the data as bit map data in the OSD area 21a of the DRAM 21. The MPEG video decoder 12 reads the bit map data from the OSD area 21a and outputs the bit map data to a monitor unit 4. Thus, a guide EPG such as a general guide can be displayed on the monitor unit 4.

When character data or the like is displayed as OSD data, since the character data stored in the EPG area 22a has been compressed, it is decompressed with a dictionary. Thus, a ROM 19 stores compressed code conversion dictionaries. The compressed code conversion dictionaries are one syllable dictionary and three word dictionaries.

A word is represented with data of two bytes. The first byte represents the types of three word dictionaries with 0, 1, and 2. The second byte represents words with 0 to 255. An encoder on the sender side sends a word with such a two-byte code. The ROM 19 has the same dictionaries as those of the encoder. With the dictionaries, the two-byte code is restored to the original word.

When a character other than the prepared words is sent, particular syllables of 252 syllable types are combined. A syllable is represented with a one-byte code.

In addition, the ROM 19 stores a relation table (an address conversion table) that represents the relation between character codes and stored positions of bit map data of fonts. With reference to the conversion table, bit map data corresponding to a particular character code is read and written to the OSD area 21a. Of course, the ROM 19 stores bit map data itself at particular addresses.

Moreover, the ROM 19 stores logo data for displaying a log, a logo ID, and an address conversion table for calling logo data (bit map data) corresponding to the logo ID. With a logo ID, the controller 7 reads logo data from the address corresponding to the ID of the ROM 19 and writs the logo data to the OSD area 21a. Thus, a logo of each broadcast station can be displayed on the monitor unit 4.

The sort table in the SRAM 11 stores data in the order of channel numbers. When a particular channel or a particular program is extracted or the order thereof is changed, the sort table is rewritten. However, the sort table is a table that stores position information (pointers) of channel data and program data. A pointer of program data and a pointer of channel data are paired. Thus, program data and channel data are rewritten as pairs.

Returning back FIG. 4, as described above, some signals received from a satellite may have been encrypted. To decrypt such signals, the IC card 15 that stores the decrypting key and the decrypting program is required. Data is input/output to/from the IC card 15 through an IC card interface 23.

In the MPEG system, a bit stream composed of digital video data and digital audio data is sent. The bit stream is separated into digital video data and digital audio data by the demultiplexer 10. The bit stream contains a time stamp composed of a PTS and a DTS that allow the digital video data to synchronize with the digital audio data. With the PTS and DTS, reproduction/output time and decode time are managed.

In the MPEG system, the bit stream contains a PCR as a time reference value. With the PCR, the value of the STC as a reference time is set and calibrated. A PLL circuit that is in association with the STC is disposed. The decoder side has an STC at a frequency that is completely the same as the frequency of the system clock of the encoder side. A clock at a frequency of 27 MHz oscillated in the PLL circuit causes the demultiplexer 10, the MPEG video decoder 12, the MPEG audio decoder 13, and the analog video encoder 17 to operate.

Figure 12:
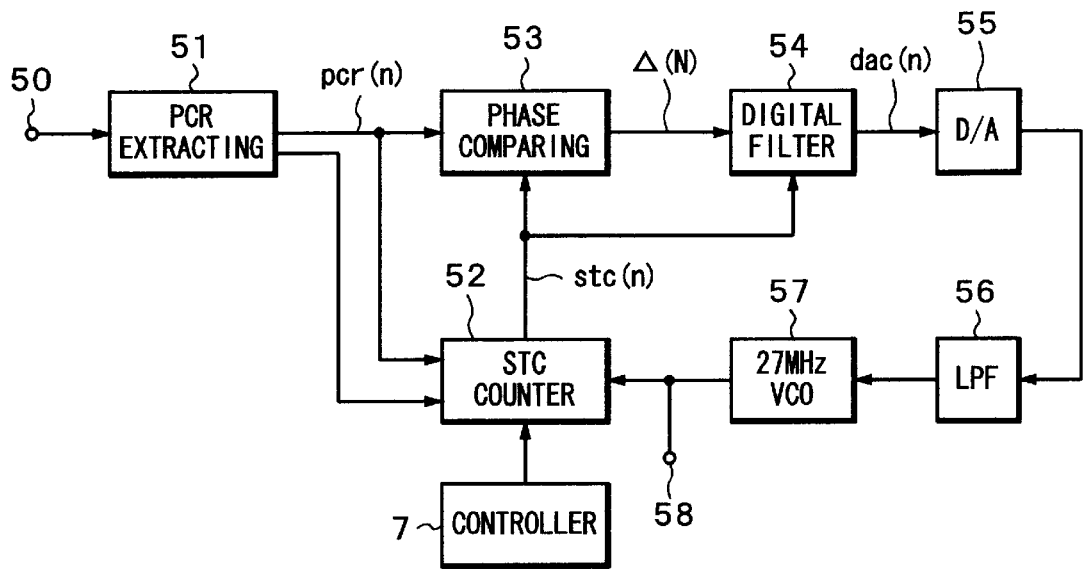
FIG. 12 is a functional block diagram showing the structure of a digital PLL of the satellite broadcast receiving apparatus according to the present invention.

FIG. 12 shows an example of the structure of such a digital PLL circuit. In FIG. 12, a PCR extracting circuit 51, an STC counter 52, and a D/A converter 55 are disposed in the demultiplexer 10 that separates the received bit stream into digital video data and digital audio data. A phase comparing portion 53 and a digital filter 54 are composed of software controlled by a CPU 4.

In FIG. 12, the received bit stream is supplied to an input terminal 50. The bit stream contains the PCR as a time reference value with which video data and audio data are decoded. The PCR extracting circuit 51 extracts the PCR as a time reference from the bit stream received from the input terminal 50.

The value of the PCR is supplied to the phase comparing portion 53 and the STC counter 52. The PCR extracting circuit 51 generates a signal that synchronizes with the detection of the PCR. This signal is supplied as a control signal that causes the counted value of the STC to be loaded to the STC counter 52.

The STC counter 52 counts the clock at a frequency of 27 MHz received from a VCO (Voltage Controlled Oscillator) 57. An output signal of the STC counter 52 is supplied to the phase comparing portion 53 corresponding to a control signal received from the PCR extracting circuit 51 and an instruction received from the controller 7.

The phase comparing portion 53 compares the value of the PCR detected by the PCR extracting circuit 51 with output data of the STC counting circuit 52 and supplies the resultant data as a phase difference output signal to the digital filter 54.

An output signal of the digital filter 54 is supplied to the D/A converter 55. The D/A converter 55 digitizes the phase difference received from the phase comparing portion 53 through the digital filter 54 with 16 bits. Output data of the D/A converter 55 is supplied to the VCO 57 through the analog low pass filter 56.

The VOC 57 oscillates the clock at a frequency of 27 MHz. The clock oscillated by the VCO 57 is controlled corresponding to an output signal of the analog low pass filter 57. The clock oscillated by the VCO 57 is supplied to the STC counter 52. In addition, the clock is output from an output terminal 58. The clock is supplied from the output terminal 58 to the MPEG video decoder 12, the MPEG audio decoder 13, and the analog video decoder 17.

The bit stream is supplied from the input terminal 50 to the PCR extracting circuit 51. The PCR extracting circuit 51 detects the PCR. The value of the PCR is initially pcr(0). At time n, the value of the PCR is pcr(n). In the control start stage, the value pcr(0) is detected. The value pcr(0) is loaded to the STC counter 52. Thus, in the control start stage, the value pcr(0) received from the PCR extracting circuit 51 accords with the value stc(0) of the STC counter 52.

The STC counter 52 advances corresponding to the clock oscillated by the VCO 57. At time n, when the value pcr(n) is detected, output data of the STC counter 52 is supplied as a counted value stc(n) to the phase comparing portion 53.

The phase comparing portion 53 compares the value of the PCR detected from the bit stream with the value of the STC of the STC counter 52 and obtains the phase difference $\Delta(\Delta=PCR-STC)$.

In the control start stage, since the value of the pcr(0) received from the PCR extracting circuit 51 accords with the value stc(0) of the STC counter 52, the phase comparison difference $\Delta(0)$ received from the phase comparing portion 53 becomes $\Delta(0)=pcr(0)-stc(0)=0$.

Normally, as time elapses, a phase difference takes place between the value of the PCR detected from the bit stream and the value of the STC counter 52. At time n, the value pcr(n) received from the PCR extracting circuit 51 does not accord with the value stc(n) of the STC counter 52. Thus, the phase comparing portion 53 outputs a phase difference $\Delta(n)$ between the value pcr(n) received from the PCR extracting circuit 51 and the value stc(n) of the STC counter 52 (namely, $\Delta(n)=pcr(n)-stc(n)$).

The phase difference $\Delta(n)$ is fed back to the VCO 57 through the digital filter 54, the D/A converter 55, and the analog low pass filter 56. In other words, the phase difference obtained by the phase comparing portion 53 is supplied to the digital filter 54. The phase comparing portion 53 outputs digital data. On the other hand, the oscillation frequency of the VCO 57 is controlled corresponding to a control voltage. Thus, with the output signal of the digital filter 54, the VCO 57 cannot be controlled.

An output signal of the digital filter 54 is supplied to the D/A converter 55. The D/A converter 55 converts the signal received from the digital filter 54 into an analog signal. The analog signal is supplied to an analog low pass filter 56. The analog low pass filter 56 removes unnecessary AC component and supplies the resultant signal to the VCO 57. With such a feedback loop, the phase difference between the value of the PCR received from the PCR extracting circuit 51 and the value of the STC of the STC counter 52 becomes 0.

In the control stage, when the phase difference $\Delta(n)$ becomes excessively large, the PCR extracting circuit 51 loads the value of the PCR at the next time as the value pcr(0) to the STC counter 52 so as to re-designate the target value and control the PLL.

Next, the structure of the digital filter 54 will be described. First of all, a feedback operation of which the phase difference between the value of the PCR and the value of the STC becomes 0 will be described. In other words, at time 0, the phase difference is 0. Thereafter, the phase difference becomes large. The phase difference to the target value designated at time 0 is compensated by the feedback operation.

As described above, the phase difference $\Delta(n)$ between the value pcr(n) of the PCR and the value stc(n) of the STC at time n is obtained as follows.

$$\Delta(n)=pcr(n)-stc(n)$$

when $\Delta(n)>0$, $pcr(n)-stc(n)>0$
Thus, $pcr(n)>stc(n)$
Consequently, the output value dac(n) of the digital filter 54 increases and the frequency of the VCO 57 increases.

In contrast, when $\Delta(n)<0$, $pcr(n)-stc(n)<0$
Thus, $pcr(n)<stc(n)$
Consequently, the output value dac(n) of the digital filter 54 decreases and the frequency of the VCO 57 decreases.

To do that, the output value dac(n) of the digital filter 54 is controlled so that the following component $$K1*\Delta(n)/elp(n) \tag{1}$$

that is proportional to the phase difference at the present time is added to the output value dac(n−1) of the digital filter at the preceding time. elp(n) is the interval between the PCR at the present time and the PCR at the preceding time.
Thus, elp(n)=stc(n)−stc(n−1)
In addition, K1>0.

The feedback operation of which the difference ($\Delta(n)-\Delta(n-1)$) between the phase difference at the present time and the phase difference at the preceding time is compensated to 0 (namely, the phase difference at the present time n is compensated to 0 based on the PCR at the preceding time (n−1)) will be described.

The difference between the phase difference $\Delta(n)$ at the present time and the phase difference $\Delta(n-1)$ at the preceding time is expressed as follows.

$$\Delta(n)-\Delta(n-1)$$

Since $\Delta(n)=pcr(n)-stc(n)$ and $$\Delta(n-1)=pcr(n-1)-stc(n-1),$$

$$\Delta(n)-\Delta(n-1)=(pcr(n)-stc(n))-(pcr(n-1)-stc(n-1))$$

Thus, when the difference between the phase difference $\Delta(n)$ at the present time and the phase difference $\Delta(n-1)$ at the preceding time is larger than 0, $$\Delta(n)-\Delta(n-1)>0$$

$$(pcr(n)-stc(n))-(pcr(n-1)-stc(n-1))>0,$$

Thus, pcr(n)−pcr(n−1)>stc(n)−stc(n−1) Consequently, the output value dac(n) of the digital filter 54 increases and the frequency of the VCO 57 increases.

When the difference between the phase difference $\Delta(n)$ at the present time and the phase difference $\Delta(n-1)$ at the preceding time is smaller than 0, $$\Delta(n)-\Delta(n-1)<0$$

$$(pcr(n)-stc(n))-(pcr(n-1)-stc(n-1))<0$$

Thus, pcr(n)−pcr(n−1)<stc(n)−stc(n−1) Consequently, the output value dac(n) of the digital filter 54 decreases and the frequency of the VCO 57 decreases.

To do that, a component that is proportional to the difference ($\Delta(n)-\Delta(n-1)$) between the phase difference $\Delta(n)$ at the present time and the phase difference $\Delta(n-1)$ at the preceding time is added to the output value dac(n−1) of the digital filter 54 at the preceding time. In other words, $$K2^*(\Delta(n)-\Delta(n-1))/elp(n) \quad (2)$$

(where $K_2>0$)
is added to the phase difference $\Delta(n)$ at the preceding time.

When two feedback operations expressed by Formulas (1) and (2) are equally considered, the following formulas are obtained.

From Formula (1), $$dac(n)=dac(n-1)+K_1^*\Delta(n)/elp(n)$$

From Formula (2), $$dac(n)=dac(n-1)+K_2^*(\Delta(n)-\Delta(n-1))/elp(n)$$

Thus, $$dac(n)=dac(n-1)+K^*(\Delta(n)+(\Delta(n)-\Delta(n-1))/elp(n)=dac(n-1)+K^*(2\Delta(n)-\Delta(n-1))/elp(n) \quad (3)$$

The constant K largely affects the instantaneous deviation of the output frequency of the VCO 57. When the value of the constant K is large, the control voltage of the VCO 57 sensitively fluctuates. Thus, the output frequency instantaneously and largely fluctuates. Consequently, in the control start stage of which the phase difference is large, the feedback operation is performed so that the phase difference becomes 0. Thus, the phase difference can be quickly converged to the allowable difference range. However, when the constant K is large, after the phase difference has been converted to the allowable difference range, the frequency instantaneously and excessively fluctuates. Alternatively, if an excessive value of the PCR is detected due to a particular cause, the frequency excessively fluctuates and thereby the clock may not be stably supplied.

In contrast, when the value of the constant K is satisfactorily small, the instantaneous fluctuation of the output frequency of the VCO is small. Thus, in the control start stage, although the convergence time to the allowable difference range becomes long, after the phase difference has been converged to the allowable difference range, the clock can be stably supplied free of large fluctuation of the output frequence of the VCO.

Figure 13:
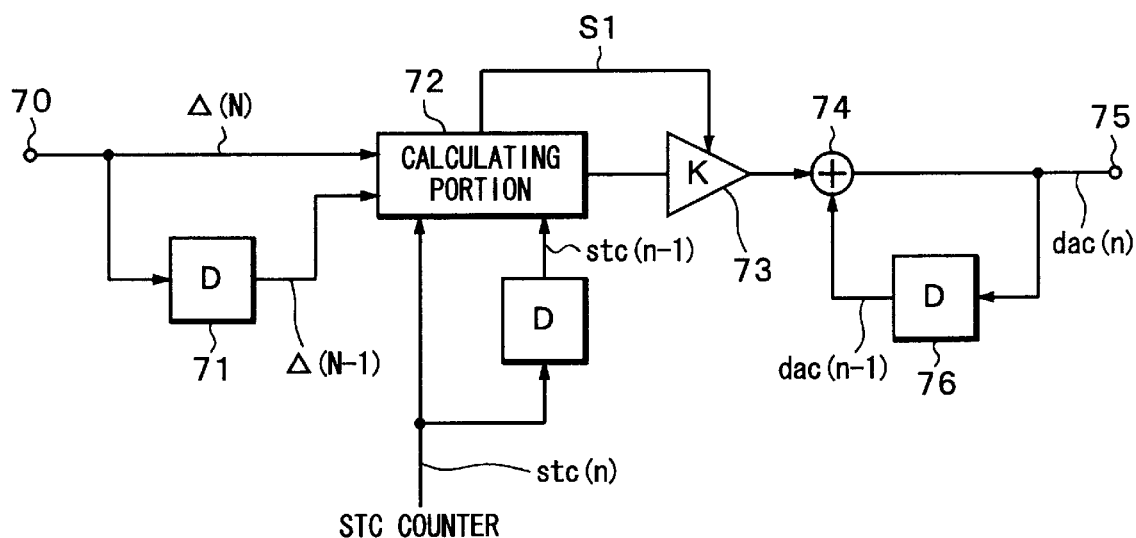
FIG. 13 is a functional block diagram showing the structure of a digital filter of the digital PLL of the satellite broadcast receiving apparatus according to the present invention.

FIG. 13 is a functional block diagram showing the structure of a digital filter 54 that accomplishes the control operation expressed by Formula (3). In FIG. 13, a phase difference $\Delta(n)$ at the present time is supplied from an input terminal 70. The phase difference $\Delta(n)$ is supplied to a calculating portion 72. In addition, the phase difference $\Delta(n)$ is supplied to a delaying circuit 71. The delaying circuit 71 outputs a phase difference $\Delta(n-1)$ at the preceding time. The phase difference $\Delta(n-1)$ at the preceding time is supplied to the calculating portion 72.

The calculating portion 72 calculates $(2\Delta(n)-\Delta(n-1))/elp(n)$ corresponding to Formula (3). Output data of the calculating portion 72 is supplied to a multiplying circuit 73. The calculating portion 72 generates a control signal S1 that controls the value of the K. The control signal S1 is supplied to the multiplying circuit 73.

The multiplying circuit 73 multiplies the output data of the calculating portion 72 by the value of the constant K and outputs $K^*(2\Delta(n)-\Delta(n-1))/elp(n)$.

Output data suppliemultiplying circuit 73 is supplied to an adding circuit 74. Output data of the adding circuit 74 is output from an output terminal 75. In addition, the output data of the adding circuit 74 is supplied to a delaying circuit 76. Output data of the delaying circuit 76 is supplied to the adding circuit 74.

The delaying circuit 76 outputs a control value dac(n−1) at the preceding time. The adding circuit 74 adds the output data of the multiplying circuit 73 and the control value dac(n−1) at the preceding time. Output data of the adding circuit 74 is output as a control value dac(n) at the present time from the output terminal 75. Thus, from the output terminal 75, as expressed by Formula (3), the control value $dac(n)=dac(n-1)+K^*(2\Delta(n)-\Delta(n-1))/elp(n)$ can be obtained.

As described above, in the case that when the value of the constant K is increased the phase difference becomes large, the phase difference can be quickly converged to the allowable difference range. However, in this case, the control operation cannot be stably performed. In contrast, in the case that when the value of the constant K is decreased, although the control operation can be stably performed, the phase difference becomes large, the phase difference cannot be quickly converged to the allowable difference range. Thus, in the control start stage, the value of the constant K is preferably increased so that the phase difference is quickly converted to the allowable difference range. When the phase difference is in the allowable difference range, the value of the constant K is decreased so that the control operation is stably performed. When the phase difference is out of the allowable difference range, the value of the constant K is increased so that phase difference is quickly pulled to the allowable difference range.

Figure 14:
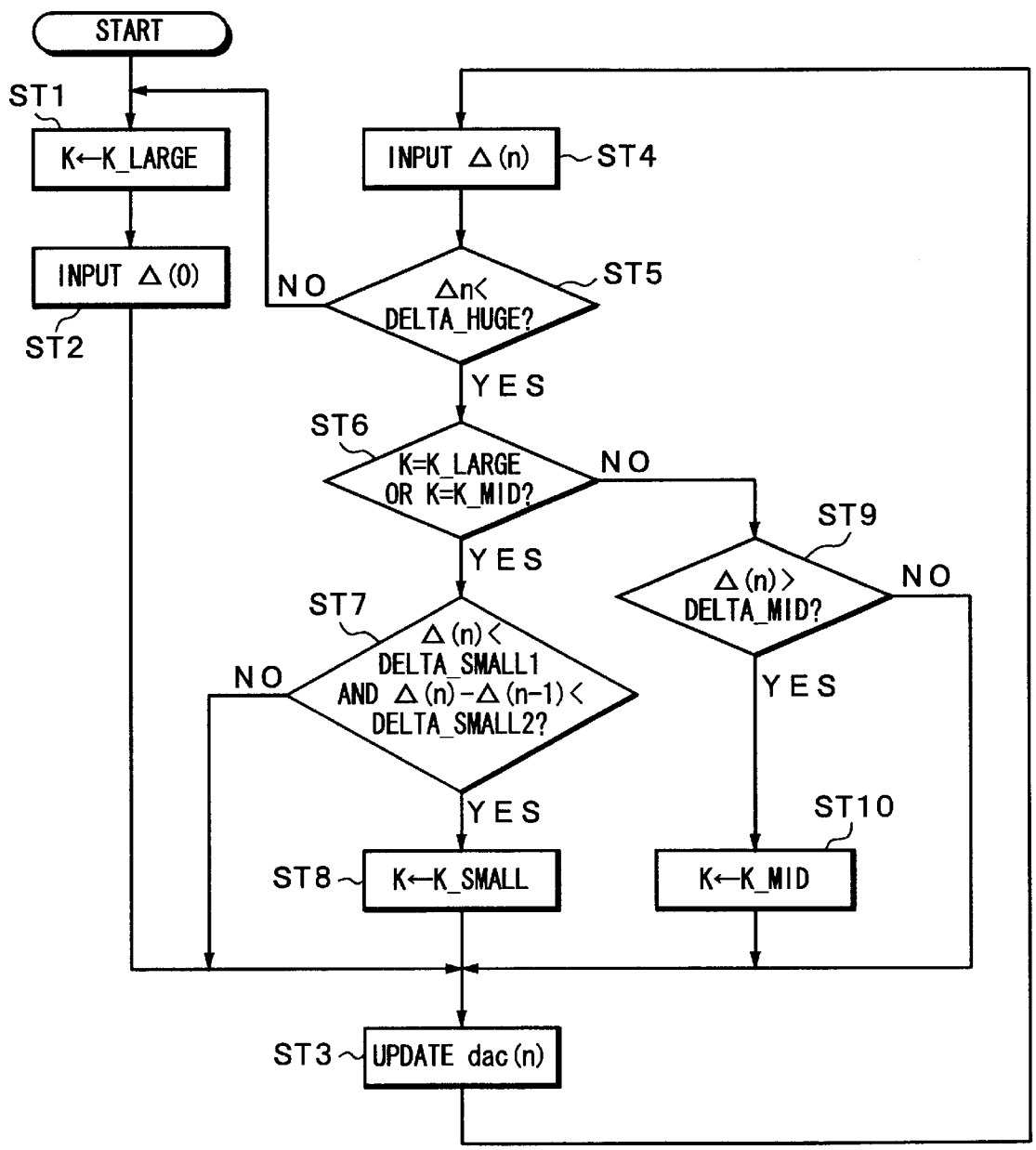
FIG. 14 is a flow chart for explaining the digital filter of the digital PLL of the satellite broadcast receiving apparatus according to the present invention.
Figure 15:
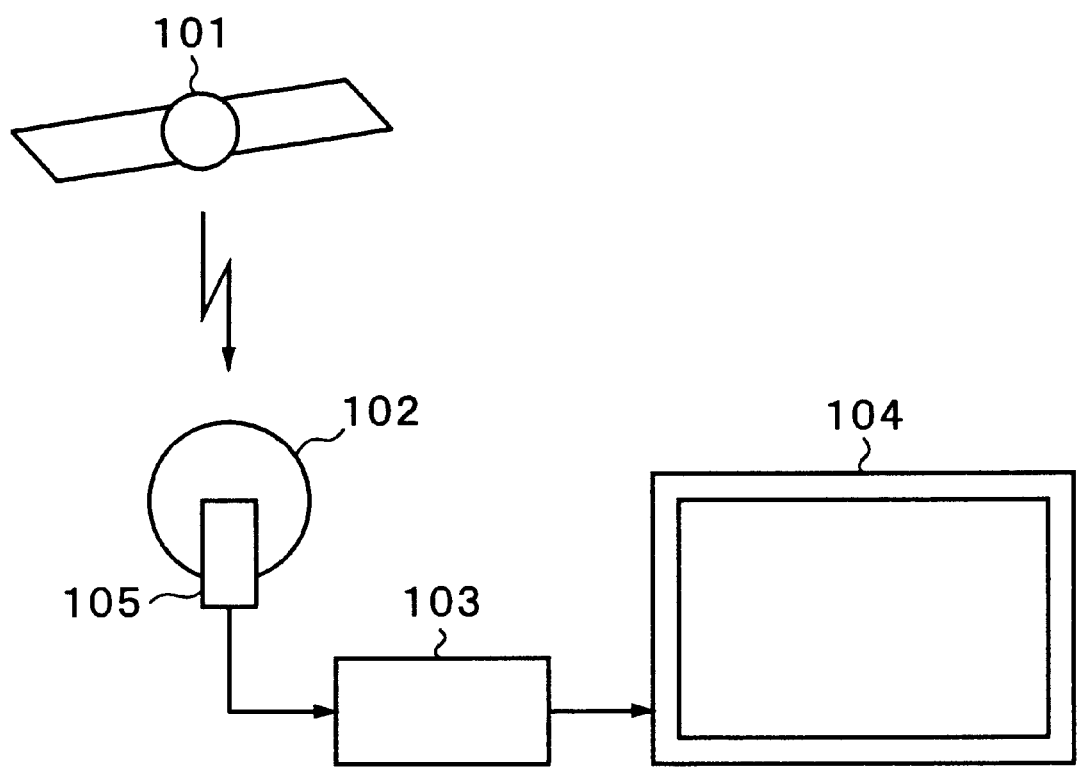
FIG. 15 is a schematic diagram for explaining a satellite broadcast receiving system.

To do that, according to the present invention, the value of the constant K is controlled corresponding to the flow chart shown in FIG. 14.

In this example, the constant K is designated as three constants K_LARGE, K_MID, and K_SMALL. These constants have the following relation.

K_LARGE>K_MID>K_SMALL

In addition, as ranges of the phase difference, DELTA_HUGE, DELTA_MID, and DELTA_SMALL1 are used. The absolute values of the difference ranges have the following relation.

DELTA_HUGE>DELTA_MID>DELTA_SMALL1

As the allowable difference range of the difference ($\Delta(n)-\Delta(n-1)$) between the phase difference at the present time and the phase difference at the preceding time, DELTA_SMALL2 is used.

In the control start stage, the large value K_LARGE is designated to the constant K (at step ST1). An initial phase difference $\Delta(0)$ is input (at step ST2). A calculation corresponding to Formula (3) is performed and thereby a control value dac(n) is updated (at step ST3). The next phase difference $\Delta(n)$ is input (at step ST4).

It is determined whether or not the phase difference $\Delta(n)$ at the present time is in the maximum difference range DELTA_HUGE (at step ST5). When the absolute value of the phase difference $\Delta(n)$ is out of the maximum difference range DELTA_HUGE, the flow returns to step ST1.

At step ST5, when the absolute value of the phase difference $\Delta(n)$ is in the maximum difference range DELTA_HUGE, it is determined whether or not the constant K is designated to K_LARGE or K_MID (at step ST6). In the control start stage, since the constant K has been designated to K_LARGE at step ST1, as the determined result at step ST6, the constant K has been designated to K_LARGE or K_MID at step ST6.

When as the determined result the constant K has been designated to K_LARGE or K_MID, it is determined whether or not the phase difference $\Delta(n)$ is in the predetermined difference range DELTA_SMALL1 and whether or not the difference ($\Delta(n)-\Delta(n-1)$) between the phase difference at the present time and the phase difference at the preceding time is in the predetermined allowable difference range DELTA_SMALL2 (at step ST7). In the control start stage, it is always determined that the difference ($\Delta(n)-\Delta(n-1)$) between the phase difference at the present time and the phase difference at the preceding time is out of the difference range DELTA_SMALL1 and the allowable difference range DELTA_SMALL2, respectively. When the difference ($\Delta(n)-\Delta(n-1)$ between the phase difference at the present time and the phase difference at the preceding time is out of the difference range DELTA_SMALL1 and the allowable difference range DELTA_SMALL2, while the constant K is K_LARGE, the flow advances to step ST3. At step ST3, the control value dac(n) is updated. Thus, in the control start stage, the constant K is designated to K_LARGE.

When as the determined result at step ST7 the difference ($\Delta(n)-\Delta(n-1)$) between the phase difference at the present time and the phase difference at the preceding time is in the difference range DELTA_SMALL1 and the allowable difference range DELTA_SMALL2, respectively, the constant K is designated to the small value K_SMALL (at step ST8).

With the newly designated constant K, dac (n) is updated (at step ST3). Thereafter, the next $\Delta(n)$ is input (at step ST4). It is determined whether $\Delta n$ is smaller than DELTA_HUGE (at step ST5). When the determined result at step ST5 is Yes, the flow advances to step ST6. At step ST6, it is determined whether or not the constant K has been designated to K_LARGE or K_MID.

When as the determined result at step ST6 the constant K has not been designated to K_LARGE or K_MID, it is determined whether or not the phase difference $\Delta(n)$ is in the allowable difference range DELTA_MID (at step ST9). When the loop has been locked, since the phase difference $\Delta(n)$ is in the allowable difference range DELTA_MID, the flow advances to step ST3. Thus, while the constant K is the small value, the same control operation is performed.

In the nearly unlock stage, the phase difference $\Delta(n)$ is out of the allowable difference range DELTA_MID. When as the determined result at step ST9 the phase difference $\Delta(n)$ is out of the allowable difference range DELTA_MID, the constant K is designated to K_MID (step ST10). Thus, in the nearly unlock stage, the constant K is designated to the middle value K_MID and the control operation is continued.

As the control operation has advanced, when as the determined result at step ST7 the difference ($\Delta(n)-\Delta(n-1)$) between the phase difference at the present time and the phase difference at the preceding time is in the difference range DELTA_SMALL1 and the allowable difference range DELTA_SMALL2, respectively, the flow advances to step ST8. At step ST8, the constant K is designated to the small value K_SMALL.

According to the present invention, in the control start stage, the constant K is designated to a large value. Thus, the phase difference is quickly converged to the allowable difference range. In the lock stage, the constant K is designated to a small value. Thus, the control operation is stably performed. In the nearly unlock stage, the constant K is designated to a middle value. Thus, the phase difference can be quickly pulled in the allowable difference range.

Although the present invention has been shown and described with respect to a best mode embodiment thereof, it should be understood by those skilled in the art that the foregoing and various other changes, omissions, and additions in the form and detail thereof may be made therein without departing from the spirit and scope of the present invention.

What is claimed is:

1. A receiving apparatus having a digital PLL circuit for generating a system clock corresponding to time reference information sent along with data and data process means for processing the data corresponding to the system clock, the PLL circuit comprising:

time reference information detecting means for detecting time reference information from the data and outputting the time reference information;

variable frequency generating means for generating a clock with a predetermined frequency;

clock count number outputting means for counting the clock and outputting the counted result;

phase comparing means for comparing the time reference information and the counted result at a timing of which the time reference information is detected; and a feedback loop for feeding back the phase difference as a control signal to said variable frequency generating means through a filter means, wherein said filter means is coupled to the phase comparing means and includes calculating means for performing a predetermined calculation on received inputs and arithmetic means for performing an arithmetic operation on an output of the calculating means in accordance with a variable factor which varies in accordance with the received inputs of said calculating means.

2. The receiving apparatus as set forth in claim 1, wherein the PLL circuit has at least a first loop gain used in a control beginning state and a second loop gain used in other than the control beginning state, the first loop gain being larger than the second loop gain.

3. The receiving apparatus as set forth in claim 1, wherein the filter means has detecting means for detecting whether the phase difference is within a predetermined phase difference, and wherein a first loop gain in the case that the phase difference is within the predetermined phase difference is smaller than a second loop gain in the case that the phase difference is not within the predetermined phase difference.

4. The receiving apparatus as set forth in claim 1, wherein the arithmetic means includes a multiplying device and wherein the multiplying device multiplies the output of said calculating means by the variable factor.

5. A receiving apparatus having a digital PLL circuit for generating a system clock corresponding to time reference information sent along with data and data process means for processing the data corresponding to the system clock, the PLL circuit comprising:

time reference information detecting means for detecting time reference information from the data and outputting the time reference information;

variable frequency generating means for generating a clock with a predetermined frequency;

clock count number outputting means for counting the clock and outputting the counted result;

phase comparing means for comparing the time reference information and the counted result at a timing of which the time reference information is detected; and a feedback loop for feeding back the phase different as a control signal to said variable frequency generating means through a filter means, wherein a designated state of the filter means is varied corresponding to the phase difference, wherein the filter means has detecting means for detecting whether the phase difference is within a predetermined phase difference, wherein a first loop gain in the case that the phase difference is smaller than a second loop gain in the case that the phase difference is not within the predetermined phase difference, wherein the detecting means further determines whether or not the difference between a first phase difference detected at first timing and a second phase difference detected at a second timing immediately preceding the first timing immediately preceding the first timing is within a predetermined difference, and wherein a loop gain of the filter means is designated to the first loop gain when the difference is within the predetermined difference and when the phase difference is within the predetermined phase difference.

6. A receiving apparatus having a digital PLL circuit for generating a system clock corresponding to time reference information sent along with data and data process means for processing the data corresponding to the system clock, the PLL circuit comprising:

time reference information detecting means for detecting time reference information from the data and outputting the time reference information;

variable frequency generating means for generating a clock with a predetermined frequency;

clock count number outputting means for counting the clock and outputting the counted result;

phase comparing means for comparing the time reference information and the counted result at a timing of which the time reference information is detected; and a feedback loop for feeding back the phase different as a control signal to said variable frequency generating means through a filter means, wherein a designated state of the filter means is varied corresponding to the phase difference, and wherein the PLL circuit divides the difference between a first phase difference detected at a first timing and a second phase difference detected at a second timing immediately preceding the first timing phase by a value corresponding to an interval between the first timing and the second timing, multiplies the divided result by a predetermined coefficient K, adds the multiplied result and a control value detected at the second timing, and obtains the added result as a control value of the first timing.

7. The receiving apparatus as set forth in claim 6, wherein the PLL circuit varies the coefficient K so as to vary the designated state.

8. A receiving method for use with a receiving apparatus having a digital PLL circuit for generating a system clock corresponding to time reference information sent along with data and data process means for processing the data corresponding to the system clock, the method comprising the steps of:

detecting time reference information from the data and outputting the time reference information;

generating a clock with a predetermined frequency;

counting the clock and outputting the counted result;

comparing the time reference information and the counted result at a timing of which the time reference information is detected;

feeding back through a filter means the phase difference as a control signal to control the clock; and varying a variable factor of the filter means, wherein the filter means includes calculating means for performing a predetermined calculation on received inputs and arithmetic means for performing an arithmetic operation on an output of the calculating means in accordance with a variable factor which varies in accordance with the received inputs of said calculating means.

9. The receiving method as set forth in claim 8, further comprising the step of:

multiplying the output of said calculating means by the variable factor.

10. A digital PLL circuit for generating a system clock corresponding to time reference information sent along with data, comprising:

time reference information detecting means for detecting time reference information from the data and outputting the time reference information;

variable frequency generating means for generating a clock with a predetermined frequency;

clock count number outputting means for counting the clock and outputting the counted result;

phase comparing means for comparing the time reference information and the counted result at a timing of which the time reference information is detected; and a feedback loop for feeding back the phase difference as a control signal to said variable frequency generating means through a filter means, wherein said filter means is coupled to the phase comparing means and includes calculating means for performing a predetermined calculation on received inputs and arithmetic means for performing an arithmetic operation on an output of the calculating means in accordance with a variable factor which varies in accordance with the received inputs of said calculating means.

11. The receiving apparatus as set forth in claim 10, wherein the arithmetic means includes a multiplying device and wherein the multiplying device multiplies the output of said calculating means by the variable factor.

* * * * *